United States Patent
Milne et al.

(10) Patent No.: US 10,446,466 B1
(45) Date of Patent: Oct. 15, 2019

(54) MECHANICALLY IMPROVED MICROELECTRONIC THERMAL INTERFACE STRUCTURE FOR LOW DIE STRESS

(71) Applicants: Raytheon Company, Waltham, MA (US); Kelvin Thermal Technologies, Inc., Boulder, CO (US)

(72) Inventors: Jason G. Milne, El Segundo, CA (US); Tse E. Wong, Los Alamitos, CA (US); Yung-Cheng Lee, Boulder, CO (US)

(73) Assignees: Raytheon Company, Waltham, MA (US); Kelvin Thermal Technologies, Inc., Boulder, CO (US)

( * ) Notice: Subject to any disclaimer, the term of this patent is extended or adjusted under 35 U.S.C. 154(b) by 0 days.

(21) Appl. No.: 15/970,724

(22) Filed: May 3, 2018

(51) Int. Cl.
*H01L 23/00* (2006.01)
*H01L 23/367* (2006.01)
*H01L 23/373* (2006.01)

(52) U.S. Cl.
CPC ...... *H01L 23/3675* (2013.01); *H01L 23/3735* (2013.01); *H01L 23/562* (2013.01)

(58) Field of Classification Search
CPC ............. H01L 23/3675; H01L 23/3735; H01L 23/562; H01L 23/34; H01L 23/373; H01L 23/3676; H01L 24/13; H01L 24/16; H01L 24/11; H01L 24/05; H01L 24/03; H01L 24/81
See application file for complete search history.

(56) References Cited

U.S. PATENT DOCUMENTS

| 4,974,119 | A | 11/1990 | Martin |
| 5,195,023 | A | 3/1993 | Manzione et al. |
| 6,830,960 | B2 | 12/2004 | Alcoe et al. |
| 8,405,996 | B2 | 3/2013 | Shaddock et al. |
| 8,537,552 | B2 | 9/2013 | Paquette et al. |
| 9,603,283 | B1 * | 3/2017 | Pillans ............ H05K 7/202 |

(Continued)

FOREIGN PATENT DOCUMENTS

WO 2016/137711 A1 9/2016

OTHER PUBLICATIONS

Bar-Cohen et al., "Nanothermal Interface Materials: Technology Review and Recent Results", Journal of Electronic Packaging, vol. 137, Issue 4, Dec. 2015, 17 pages.

(Continued)

*Primary Examiner* — Nikolay K Yushin

(57) ABSTRACT

A heat dissipation structure for a semiconductor integrated circuit die having a plurality of connection areas may include a thermal mount comprising a plurality of pillars each having an aspect ratio preferable greater than 2:1 and each positioned to connect to one of the connection areas on a peripheral portion of the semiconductor integrated circuit die with one of a plurality of interface layers. A thermal conductivity of materials for the connection areas, the thermal mount, the pillars, each of which is preferably copper, and the interface layers, which are preferably copper nanoparticle layers, has a thermal conductivity greater than 100 Watts per meter degree Kelvin (W/m·K). Flexure of the pillars accommodates mechanical strain arising from temperature changes and differences in coefficients of thermal expansion for materials of the semiconductor integrated circuit die and the thermal mount.

20 Claims, 6 Drawing Sheets

(56) References Cited

U.S. PATENT DOCUMENTS

| | | |
|---|---|---|
| 2013/0199767 A1 | 8/2013 | Karidis et al. |
| 2014/0246770 A1 | 9/2014 | Jha et al. |
| 2016/0104655 A1 | 4/2016 | Kawabata |
| 2016/0141222 A1 | 5/2016 | Sato |
| 2017/0005026 A1 | 1/2017 | Starkovich et al. |
| 2017/0105311 A1* | 4/2017 | Pillans .................. H05K 7/202 |

OTHER PUBLICATIONS

Riveros et al., "Crystallographically-oriented single-crystalline copper nanowire arrays electrochemically grown into nanoporous anodic alumina templates", Applied Physics A, Materials Science & Processing, vol. 81, No. 1, Jun. 2005, pp. 17-24.

Barako et al., "Thermal Conduction in Vertically Aligned Copper Nanowire Arrays and Composites", ACS Applied Materials & Interfaces, vol. 7, No. 34, Sep. 2015, pp. 19251-19259.

International Search Report and Written Opinion of the International Searching Authority dated Apr. 15, 2019 in connection with International Patent Application No. PCT/US2019/013445, 14 pages.

\* cited by examiner

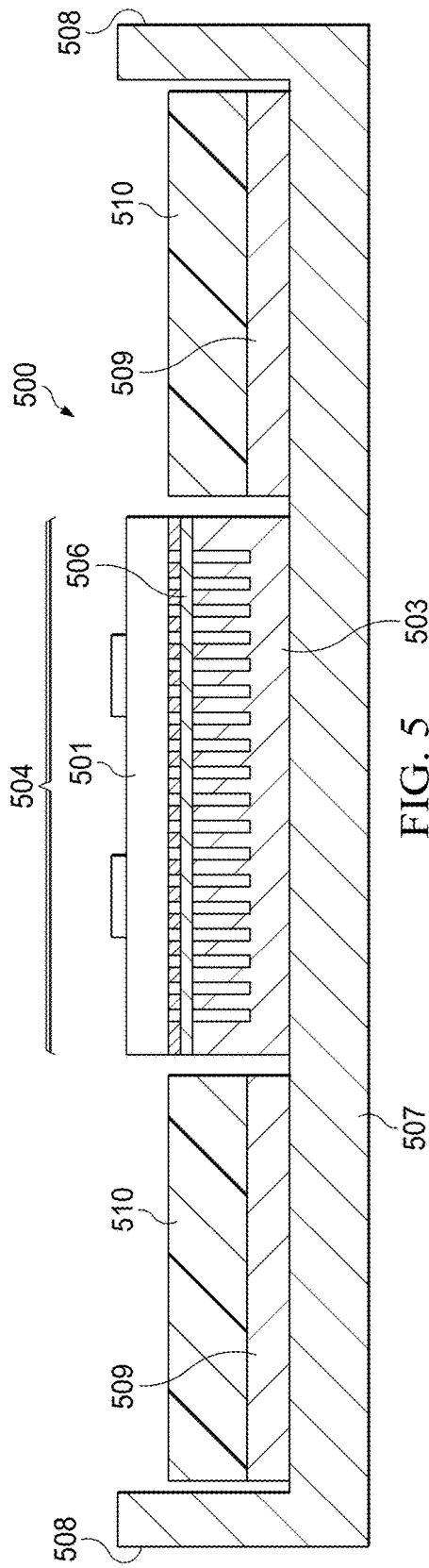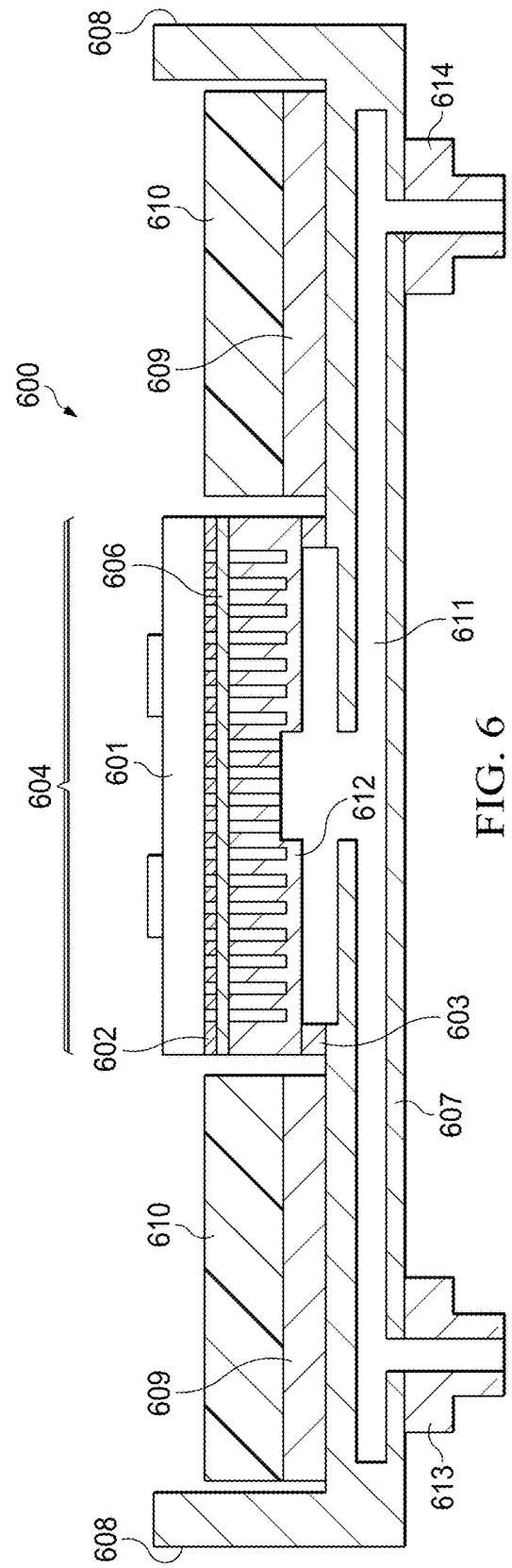

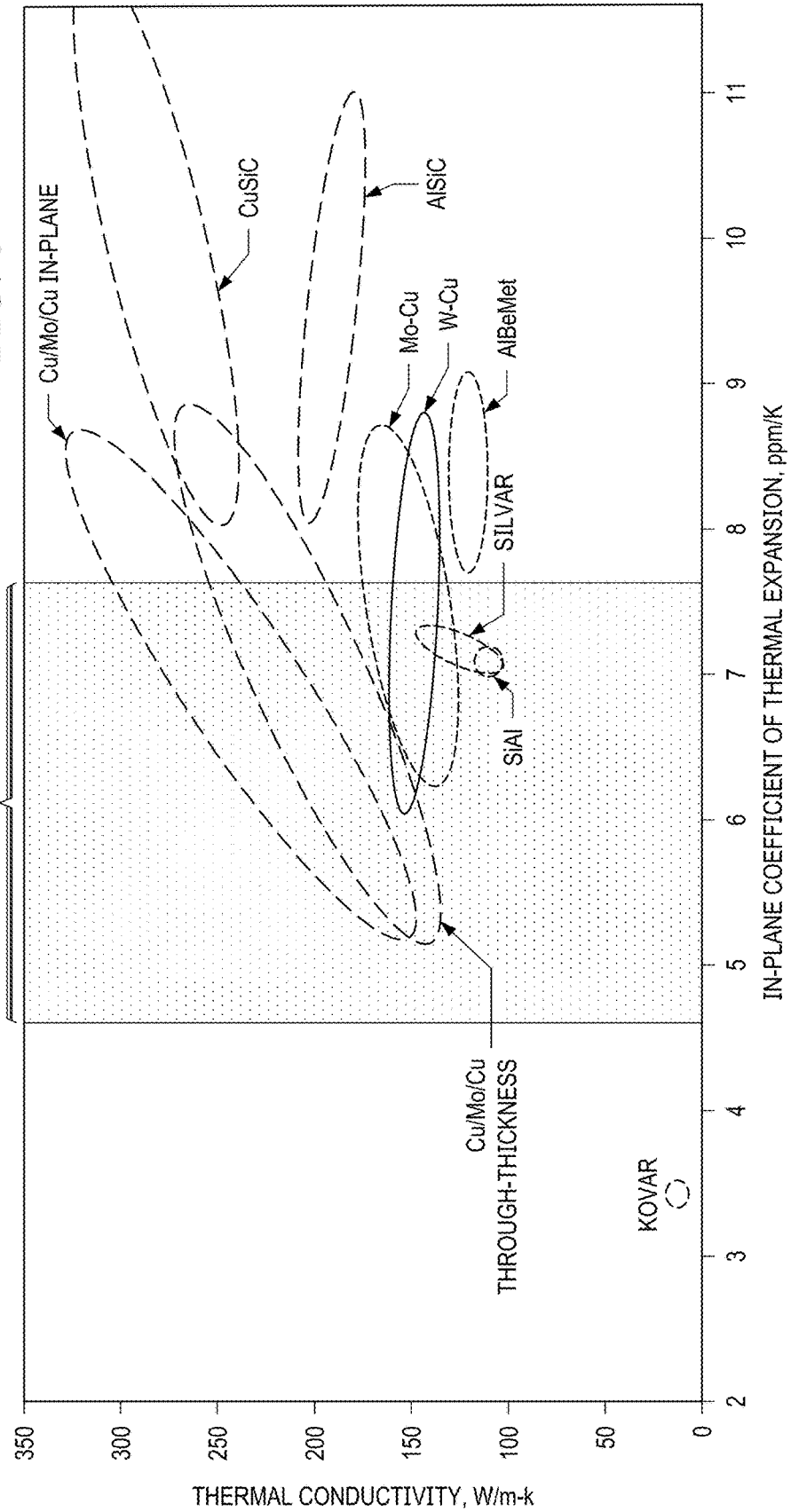

MECHANICALLY IMPROVED MICROELECTRONIC THERMAL INTERFACE STRUCTURE FOR LOW DIE STRESS

TECHNICAL FIELD

The present disclosure is directed in general to integrated circuit packaging and more particularly to mounting integrated circuit substrates to a heat spreader.

BACKGROUND OF THE DISCLOSURE

Packaged integrated circuit microelectronic devices are growing in thermal dissipation and heat flux density. Typically containing an integrated circuit substrate made of silicon, silicon carbide (SiC), gallium arsenide (GaAs), indium phosphide (InP), or the like, the integrated circuit substrates have a lower coefficient of thermal expansion (CTE) than typical heat spreader materials such as copper or aluminum. It is desirable to be able to attach these devices to a typical heat spreader made of materials like copper without increased die stress due to CTE and relatively high process temperatures.

SUMMARY OF THE DISCLOSURE

A heat dissipation structure for a semiconductor integrated circuit die having a plurality of connection areas may include a thermal mount comprising a plurality of pillars projecting from a surface thereof, each of the pillars having an aspect ratio greater than 1:1 (preferably greater than 2:1) and each of the pillars positioned to connect to one of the connection areas on a peripheral portion of the semiconductor integrated circuit die. Each of a plurality of interface layers connect one of the pillars and the respective one of the connection areas on the semiconductor integrated circuit die. A thermal conductivity of materials for each of the connection areas, the thermal mount, the pillars and the interface layers is preferably greater than 100 Watts per meter degree Kelvin (W/m·K), and flexure of the pillars accommodates mechanical strain arising from temperature changes and differences in coefficients of thermal expansion for materials of the semiconductor integrated circuit die and the thermal mount. The connection areas, the thermal mount and the pillars may optionally each comprise copper, and the interface layers may optionally each comprise copper nanoparticle layers. Each of the pillars may have an aspect ratio dependent upon a position of one of the connection areas corresponding to the respective pillar relative to a center of the semiconductor integrated circuit die, with pillars further from the center have a greater aspect ratio than pillars closer to the center. The thermal mount may include a central support projecting from the surface thereof, the central support having an aspect ratio less than 1:1 and connected to one of the connection areas on a central portion of the semiconductor integrated circuit die by one of the plurality of interface layers, in which event the connection areas, the thermal mount, the pillars and the central support may optionally each comprise copper, and wherein the interface layers may optionally each comprise copper nanoparticle layers. Each of the pillars may be formed to flex in any direction in the X, Y or Z planes. The heat dissipation structure may optionally include a copper heat spreader on a circuit board, and a copper nanoparticle interface layer connecting the thermal mount and the copper heat spreader.

Forming a heat dissipation structure for a semiconductor integrated circuit die having a plurality of connection areas may include forming a thermal mount comprising a plurality of pillars projecting from a surface thereof, each of the pillars having an aspect ratio greater than 1:1 and each of the pillars positioned to connect to one of the connection areas on a peripheral portion of the semiconductor integrated circuit die, and connecting each one of the pillars to a respective one of the connection areas with one of a plurality of interface layers. A thermal conductivity of materials for each of the connection areas, the thermal mount, the pillars and the interface layers is preferably greater than 100 Watts per meter degree Kelvin (W/m·K), and flexure of the pillars accommodates mechanical strain arising from temperature changes and differences in coefficients of thermal expansion for materials of the semiconductor integrated circuit die and the thermal mount.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 5 is a diagrammatic side sectional view of a first extension of a mechanically improved microelectronic thermal interface structure for low die stress in accordance with embodiments of the present disclosure;

FIG. 6 is a diagrammatic side sectional view of a second extension of a mechanically improved microelectronic thermal interface structure for low die stress in accordance with embodiments of the present disclosure;

FIG. 8 is a plot, for a number of materials, of the thermal conductivity as a function of the in-plane coefficient of thermal expansion for the respective material.

DETAILED DESCRIPTION

Figure 1A:
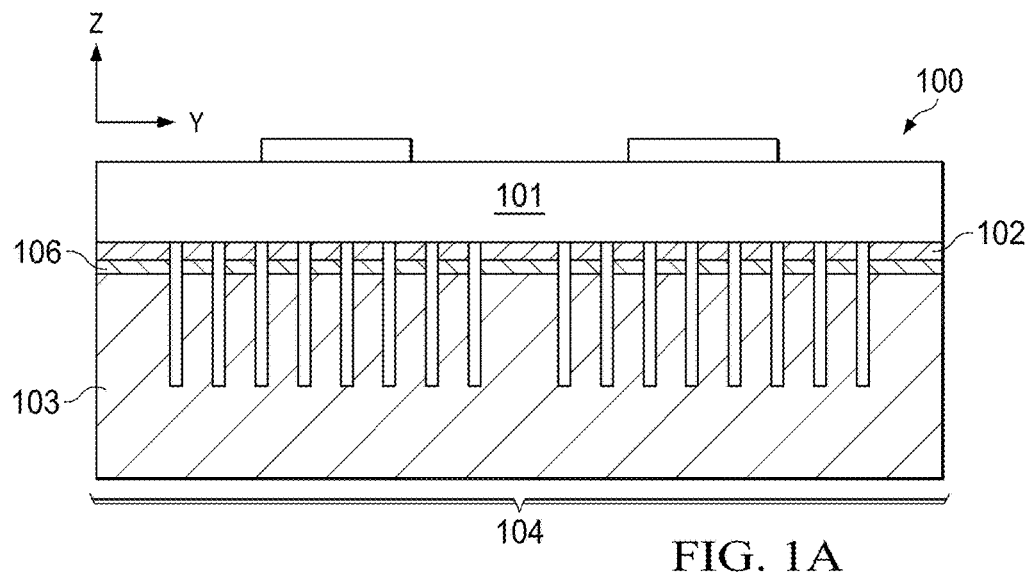
FIGS. 1A, 1B and 1C are diagrammatic side sectional and plan sectional views of a mechanically improved microelectronic thermal interface structure for low die stress in accordance with embodiments of the present disclosure.

It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below. Additionally, unless otherwise specifically noted, articles depicted in the drawings are not necessarily drawn to scale.

Mounting an integrated circuit substrate made of silicon, silicon carbide, gallium arsenide, indium phosphate, or the like to typical heat spreader materials such as copper or aluminum involves a CTE mismatch, which limits fabrication processing temperatures to those sufficiently low to avoid mechanical problems resulting from the CTE mismatch. Mechanical stress or strains due to CTE mismatch may also result in packaging or connection failures based on changes in ambient temperatures (e.g., cold winters and hot summers) and/or operating temperatures of the packaged semiconductor integrated circuit. Possible techniques for addressing CTE mismatch include: specialty materials and alloys with controlled CTE or enhanced thermal conductivity thermal interface materials (i.e., solders, adhesives, gaskets, gap pads, greases, etc.); and solder reflow using flux and preforms and/or forming gas, which may require expensive fixtures or high temperature processes. For example, materials for high thermal conductivity heat spreaders require plating and at least one, usually two, thermal interface materials (TIMs) to attach between a device and the package housing. The thermal conductivity, in Watts per meter-Kelvin (W/m·K), for the materials within a typical stack attaching an integrated circuit substrate to a heat spreader is given in TABLE 1 below:

TABLE 1

| Material | Thermal Conductivity (W/m · K) |
| --- | --- |
| gallium nitride (GaN) | 130 |
| aluminum gallium nitride (AlGaN) | 19 |
| silicon nitride (SiN) (passivation) | 33 |
| silicon carbide (SiC) | 430 |
| gold (Au) | 317 |
| gold tin (AuSn) (die attach) | 57 |
| copper molybdenum copper (CuMoCu) (package) | 300 |
| copper (Cu) (fixture) | 370 |

Figure 1B:
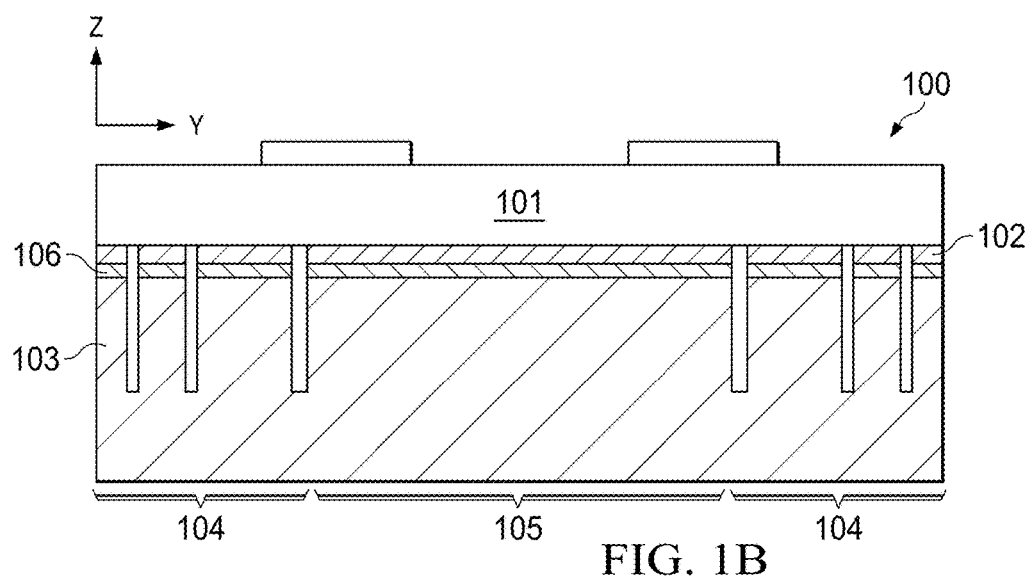
Figure 1C:
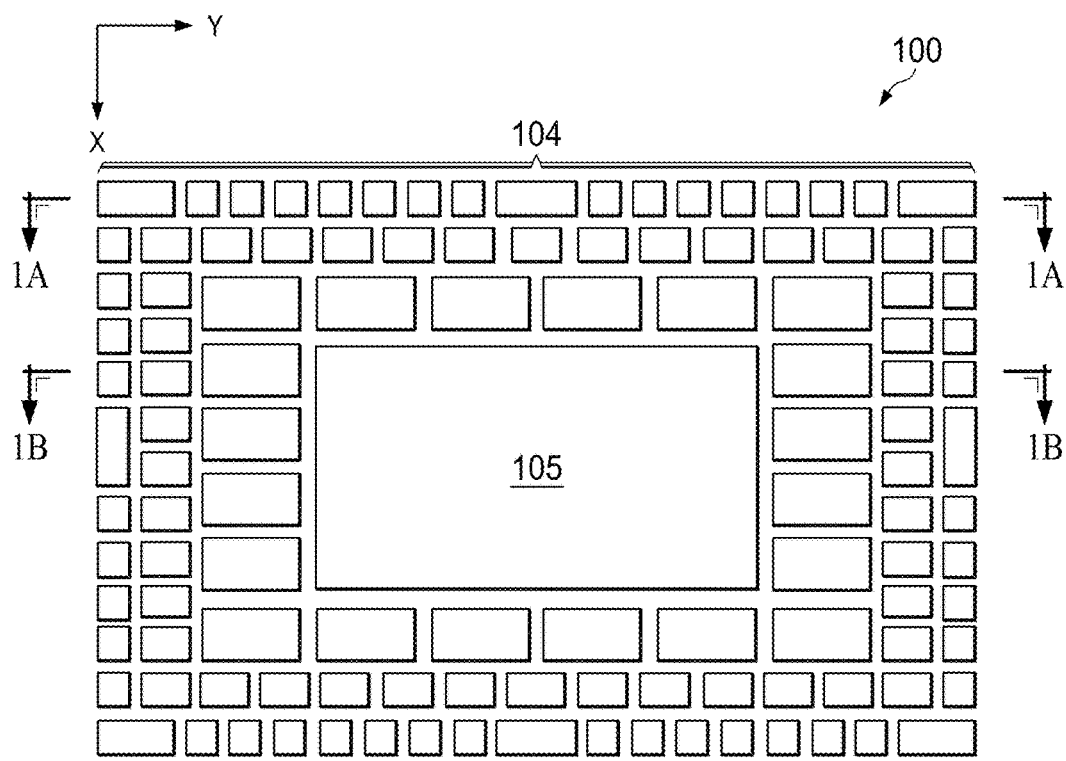

FIGS. 1A, 1B and 1C are diagrammatic side sectional and plan sectional views of a mechanically improved microelectronic thermal interface structure for low die stress in accordance with embodiments of the present disclosure. An integrated circuit mounting structure 100 includes a semiconductor integrated circuit die (or "chip") 101 on which is formed patterned connection areas 102, which may be formed of copper in one exemplary embodiment and may be patterned, for example, by machining, micromachining, or other methods forming comparably-dimensioned structures. A thermal mount 103 for mounting the semiconductor integrated circuit die 101 to a heat spreader (not shown) includes a base from which project a plurality of pillars 104 and, optionally, a central solid core 105. In one exemplary embodiment, the thermal mount 103 may be formed of copper patterned to form the gaps between the pillars 104 and around the central solid core 105 (if present). Even if the thermal mount 103 is not formed completely of copper, the pillars 104 and/or central solid core 105 may have patterns such that more than 80% of the contact with the semiconductor integrated circuit die 101 is copper, for maximum heat transfer area. While the pillars 104 are depicted as having a rectangular cross-section, cylindrical (circular or oval cross-section) pillars may also be employed. More complex three-dimensional geometries and multi-faceted geometries, including but not limited to helical, spiral, complex sweep paths, notched, or zig-zag (see, e.g., FIG. 3), that affect stiffness and thermal cross-section are also contemplated in this disclosure. The ends of the pillars 104 and the central solid core 105 (if present) are attached to the patterned connection areas 102 by a metallic connection layer(s) 106. In one exemplary embodiment, the metallic connection layer(s) 106 may be a copper nanoparticle layer.

The pillars 104 flex to enable thermal expansion with low stress despite CTE mismatch. The pillars 104 are designed to flex in the X-Y plane and/or Z direction, to accommodate mechanical stress resulting from materials CTE mismatch and temperature excursions during fabrication processing and/or operation. If the semiconductor integrated circuit die 101 is formed of silicon, the in-plane rate of thermal expansion will typically be about 2.6 ppm per degree Celsius (° C.) or degree Kelvin; for a GaAs semiconductor integrated circuit die 101, the in-plane rate of thermal expansion will typically be 7-8 ppm/° C. Flexure of the pillars 104 accommodates mechanical stress due to differences between the in-plane rates of thermal expansion for the material of the semiconductor integrated circuit die 101 and the pillars 104. The aspect ratio (height-to-width or, equivalently, height-to-diameter) of the pillars 104 is selected to facilitate such flexing. An aspect ratio of at least 1:1, and more preferably equal to or greater than 2:1, for the pillars 104 provides the strain relief necessary to accommodate CTE mismatch and resulting mechanical stresses during higher temperature fabrication processing or at elevated temperatures occurring during operation.

In some embodiments, the outer or peripheral ones of the pillars 104 will have a higher aspect ratio than those closer to the central region (in the X-Y plane) of the thermal mount 103. The central solid core 105 of the thermal mount 103 has the largest possible area given tolerable strain due to CTE mismatch of the materials employed. The central region of the thermal mount 103 has the lowest stress due to CTE mismatch, and may be taken as a neutral point. From the edges of the central solid core 105, the aspect ratio of the pillars 104 increases in the direction of the edges of the thermal mount 103—that is, the aspect ratio of each pillar 104 is generally proportional to that pillar's position relative to the center of the semiconductor integrated circuit die 101, forming a gradient from large aspect ratio to small aspect ratio along the lines from the center of the semiconductor integrated circuit die 101 (and/or the thermal mount 103) to each corner. In the embodiment illustrated, the columns within the thermal mount 103 have uniform height, which means that the length/width (or diameter) of the columns should decrease from the center to the corners. In alternative designs, the length/width (or diameter) of the columns may be kept the same from the center to the corners, but the column height may increase (e.g., by forming longer gaps between neighboring columns near the edges than at the center). In still other designs, both the length/width (or diameter) and the height of the columns may vary depending upon that pillar's position relative to the center of the semiconductor integrated circuit die 101 and/or the thermal mount 103. Peripheral pillars 104 will generally have a greater aspect ratio than more central pillars, providing more flex. However, as shown for the corner and center peripheral pillars in FIG. 1C, not all pillars that are at or further than a given distance from the center necessarily have the same cross-sectional area and/or column height. For mechanical reasons, some pillars may have a lower aspect ratio than neighboring pillars of similar distance from the center. Pillars are also sized to match heat dissipation hot spots on the device or substrate, and so may vary in more complex patterns to further optimize tradeoffs between heat conduction and mechanical flexure.

As noted above, the ends of the pillars 104 and the central solid core 105 (if present) may be attached to the patterned connection areas 102 by a copper nanoparticle metallic connection layer(s) 106. The high thermal conductivity of a copper nanoparticle TIM (K=390 W/m·K) exceeds solders and other common thermal interface materials shown in TABLE 2 below:

TABLE 2

| TIM | Thermal Conductivity (W/m · K) |
| --- | --- |
| Au80Sn20 | 57 |
| Sn63Pb37 | 50 |
| SnAgCu ("SAC") alloys | 60 |
| Indium | 86 |
| Epoxy | <3 |
| Grease | <6 |

In addition, copper nanoparticles may be formed using low temperature sintering (e.g., ranging from 170 to 225° C. depending on particle sizes), low pressure fabrication processing and with chemistries that are not unique to formation of a thermal interface material. The thickness of the copper nanoparticle layers 106 may be on the order of micrometers (µm) or nanometers (nm), since (as known in the art) the copper nanoparticles are formed by growing sparse copper grains on the surface having bonding that collapses under mechanical pressure and, with diffusion across the layer's own interface barrier, forms a monolithic layer. The CTE for copper puts die in slight compression after cooling to room temperature, which is preferred.

Figure 2A:
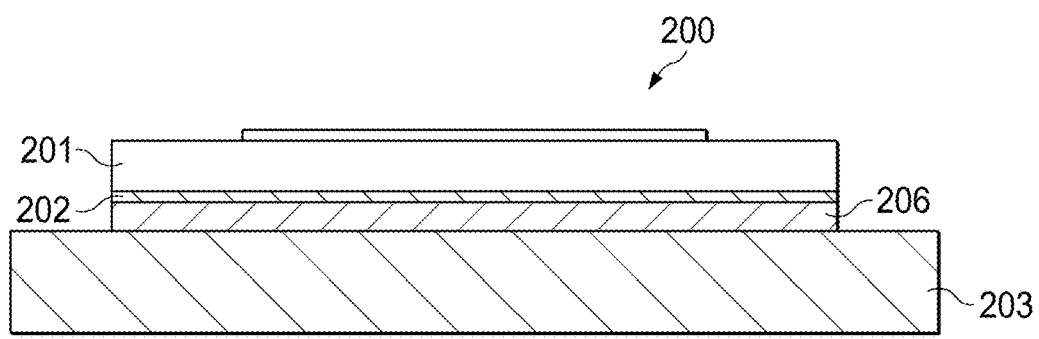
FIGS. 2A and 2B are comparative diagrammatic illustrations of a solder thermal interface structure and a mechanically improved microelectronic thermal interface structure for low die stress in accordance with embodiments of the present disclosure.
Figure 2B:
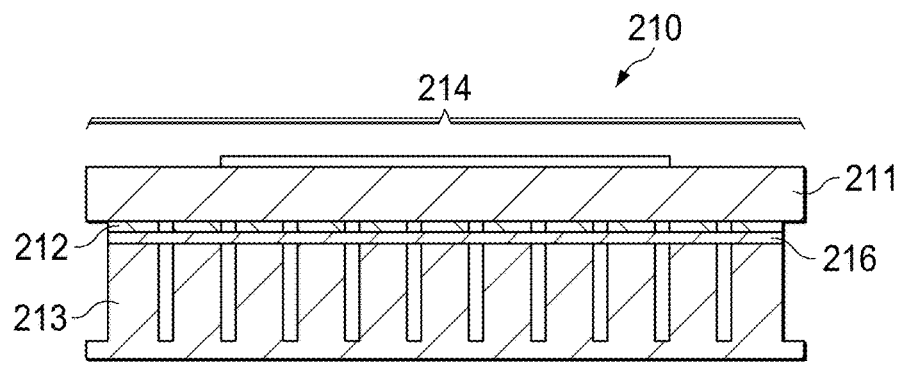

FIGS. 2A and 2B are comparative diagrammatic illustrations of a solder thermal interface structure and a mechanically improved microelectronic thermal interface structure for low die stress in accordance with embodiments of the present disclosure. FIG. 2A depicts an integrated circuit mounting structure 200 employing a heat spreader with a solder thermal interface material, while FIG. 2B depicts an integrated circuit mounting structure 210 of the type depicted in FIGS. 1A through 1C and described above. Each integrated circuit mounting structure 200, 210 includes a semiconductor integrated circuit die 201, 211. The materials stack for the integrated circuit mounting structure 200 includes gold metal backing 202 and a gold-tin (Au80Sn20) thermal interface material, an aluminum diamond heat spreader 206 for thermal dissipation and CTE mismatch, solder (Sn63Pb37), which is not visible in FIG. 2A, and a housing (CuMoCu) 203. By contrast, the materials stack for the integrated circuit mounting structure 210 includes patterned copper contact areas 212, copper nanoparticle layer(s) 216, pillars 214, and a copper base 213. The thermal conductivities for the materials within the two stacks are given in TABLE 3 below:

TABLE 3

| | Solder TIM | | Pillar Structure | |
| --- | --- | --- | --- | --- |
| | Material | Thermal Conductivity (W/m · K) | Material | Thermal Conductivity (W/m · K) |
| Die | SiC | 430 | SiC | 430 |
| Back metal | Au | 317 | Cu | 370 |
| TIM1 | Au80Sn20 | 57 | Cu (nanoparticle) | 370 |
| Spreader | Al Diamond | 500 | Cu (pillars) | 370 |
| TIM2 | Sn63Pb37 | 50 | N/A | — |
| Housing | CuMoCu | 300 | Cu (base) | 370 |

As evident, the entire materials stack for the integrated circuit mounting structure 210 has a relatively uniform thermal conductivity, in comparison with the thermal conductivities for the materials stack for integrated circuit mounting structure 200. If all materials within a heat dissipation structure between the semiconductor device and the circuit board have a thermal conductivity greater than 100 W/m·K, then "choke point(s)" or inhibitors of heat dissipation by the materials stack for the integrated circuit mounting structure 210 are therefore less likely to occur, and are more likely to be due to the physical design than from the materials used. The use of copper nanoparticle layers 216 and copper pillars 214 are novel aspects of the design in FIG. 2B contributing to the improved thermal performance of the integrated circuit package using the integrated circuit mounting structure 210. Only a small fraction of the contact area to the semiconductor integrated circuit die 211 by copper pillars 214 (via copper nanoparticle layers 216 and patterned copper contact areas 212) is sacrificed relative to the contact between heat spreader (tab) 203 and semiconductor integrated circuit die 201. In addition, due to lower differences in the materials' CTEs (not listed in TABLE 3, although the two TIMs are known to have low K), temperature excursions during fabrication processing and/or operation are therefore less likely to result in mechanical failure due to stress caused by CTE mismatch. Moreover, the material for the heat spreader 206 and the housing 203 are expensive, increasing the cost of the packaged integrated circuit.

Figure 3:
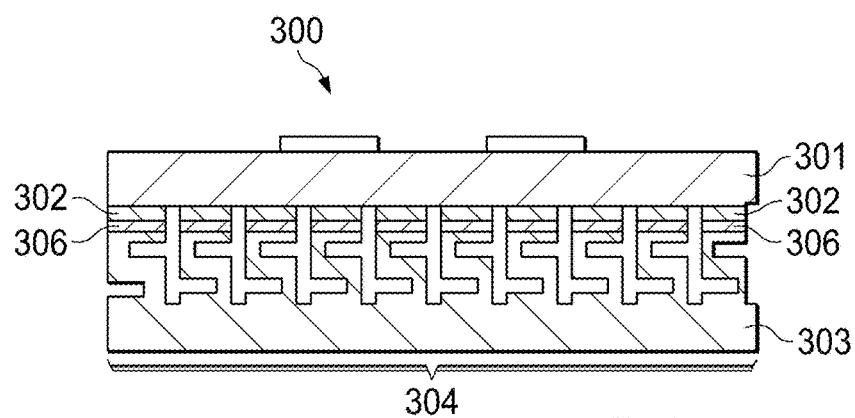
FIG. 3 is a diagrammatic side sectional views of a mechanically improved microelectronic thermal interface structure for low die stress in accordance with one alternative set of embodiments of the present disclosure.

FIG. 3 is a diagrammatic side sectional view of a mechanically improved microelectronic thermal interface structure for low die stress in accordance with one alternative set of embodiments of the present disclosure. The integrated circuit mounting structure 300 includes a semiconductor integrated circuit die 301, patterned connection areas 302, a thermal mount 303, and metallic connection layer(s) 306 comparable to the corresponding structures described above. However, the pillars 304 include additional, lateral (X-Y) gaps or cuts, forming S-shaped spring pillars flexing at the ends in the X and Y directions and compressing or expanding in the Z direction to enable Z-axis compliance for bond tolerances, increased lateral flexibility, and increased thermal surface area for cross-flow cooling. The additional cuts can be machined directly into the module housing during formation of the thermal mount 303 and pillars 304.

Figure 3A:
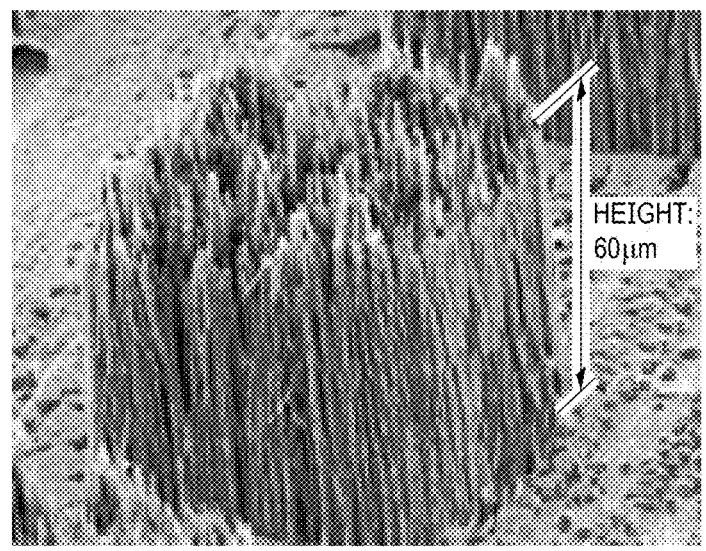
FIG. 3A is an image of nanowires or microwires that may be used as pillars within embodiments of the present disclosure.

FIG. 3A is an image of nanowires or microwires that may be used as pillars within embodiments of the present disclosure. By way of example, the nanowires or microwires may be used in place of the S-shaped spring pillars 304 shown in FIG. 3. Nanowire and microwire structures have aspect ratios much greater than 2:1, in the range of 10:1, 50:1, 100:1, or even 500:1. Despite such extremely high aspect ratios and the often irregular geometry, as shown in FIG. 3A, nanowires and microwires are considered "pillars" for the purposes of this disclosure. Due to a larger aspect ratio of wire length versus wire diameter, nanowires or microwires are well suited to de-couple the CTE mismatch between the semiconductor integrated circuit die and the heat spreader or thermal mount. In addition, it should be noted that nanowires and microwires—like other pillar structures disclosed herein—need not be copper, but may alternatively be formed of other materials such as silicon.

Figure 4:
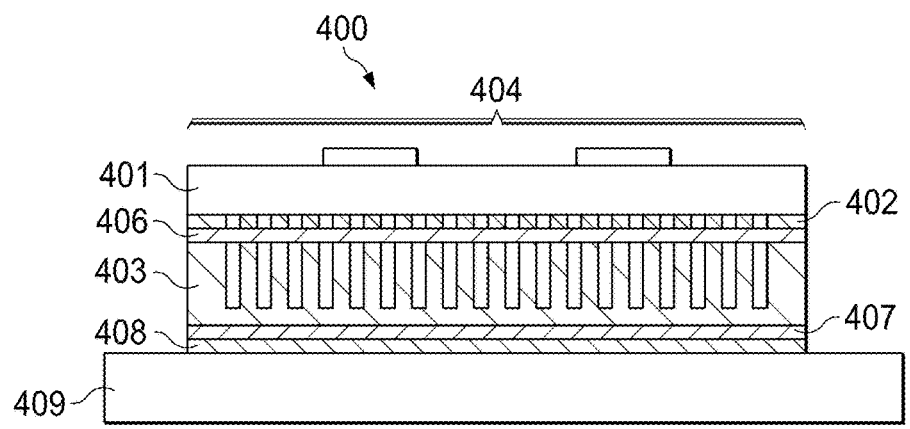
FIGS. 4 and 4A are diagrammatic side sectional views of a mechanically improved microelectronic thermal interface structure for low die stress in accordance with another alternative set of embodiments of the present disclosure.
Figure 4A:
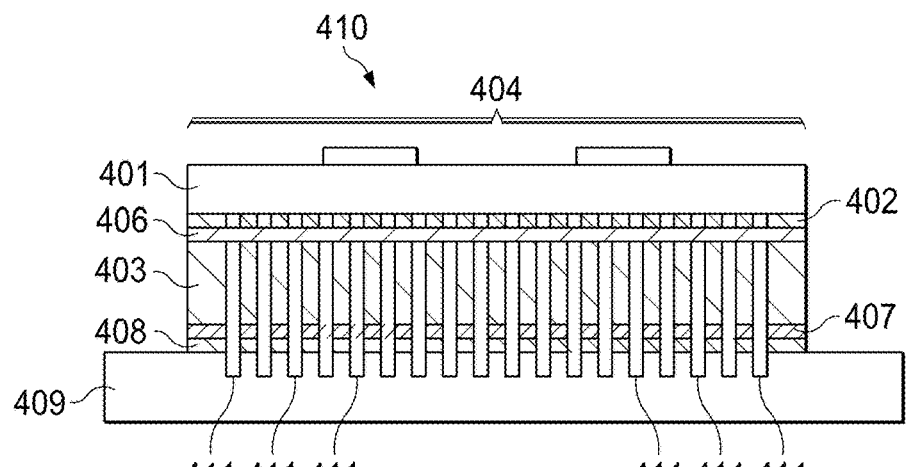

FIG. 4 is a diagrammatic side sectional view of a mechanically improved microelectronic thermal interface structure for low die stress in accordance with another alternative set of embodiments of the present disclosure. The integrated circuit mounting structure 400 includes a semiconductor integrated circuit die 401, patterned connection areas 402, a thermal mount 403, pillars 404, and metallic connection layer(s) 406 comparable to the corresponding structures described above. In addition, a copper nanoparticle layer 407 allows direct attachment of the thermal mount 403 to a copper pad 408 on a PCB 409 with CTE matching. As shown in the alternate integrated circuit mounting structure 401 of FIG. 4A, local cuts 411 or other material removal or shaping, and the resulting pillar-like features, can also be implemented to extend into the PCB as well, to extend the flexible sections of the thermal path down into the PCB layers for further strain relief below and around the mounted device. The PCB pillars may include copper-filled vias or lateral circuits for electrical and thermal connections. PCB materials, with a thermal expansion rate of about 16-17 ppm/C, are reasonably well-matched to copper. Standard surface mount solder in lieu of the copper nanoparticle layer 407 is also an option.

FIG. 5 is a diagrammatic side sectional view of a first extension of a mechanically improved microelectronic thermal interface structure for low die stress in accordance with embodiments of the present disclosure. The integrated circuit mounting structure 500 includes a semiconductor integrated circuit die 501, patterned connection areas 502, pillars 504, and metallic connection layer(s) 506 comparable to the corresponding structures described above. The thermal mount 503, however, includes flanges 507 and sidewalls 508 forming a module base or lid. The thermal mount 503 may be formed entirely of copper, or may alternatively be formed from a bulk aluminum structure with a copper interface. Integrated pedestal(s) each including a heat spreader 509 and PCB attachment area 510.

FIG. 6 is a diagrammatic side sectional view of a second extension of a mechanically improved microelectronic thermal interface structure for low die stress in accordance with embodiments of the present disclosure. The integrated circuit mounting structure 600 includes a semiconductor integrated circuit die 601, patterned connection areas 602, pillars 604, and metallic connection layer(s) 606 comparable to the corresponding structures described above. As with the embodiments of FIG. 5, the thermal mount 603 includes flanges 607 and sidewalls 608 forming a module base or lid (and may be formed entirely of copper or from bulk aluminum structure with a copper interface), and may support or be supported by integrated pedestal(s) each including a heat spreader 609 and PCB attachment area 610. In the embodiment of FIG. 6, the thermal mount 603 and flanges 607 include fluid conduits compatible with liquid coolant within those structures, as well as (optionally) within the gaps or channels 612 between pillars 604. The flanges 607 of the thermal mount 603 may include ports 613, 614 for injection/extraction of fluid into the channels 611, 612.

The combination of free-standing pillars and fluid cooling may be implemented with the fluid proximate to only certain sections of the semiconductor integrated circuit die area, such as the center. That is, the gaps or channels 612 between neighboring pillars may contain fluid or not, depending upon the pillars' position relative to the center of the semiconductor integrated circuit die 601. Fluid cooling will be most beneficial adjacent the center of the semiconductor integrated circuit die 601, while it may be more important that pillars 604 adjacent the periphery or edges of the semiconductor integrated circuit die 601 be free-standing, to flex in response to temperature-related strain, rather than be sealed to retain fluid.

Figure 7:
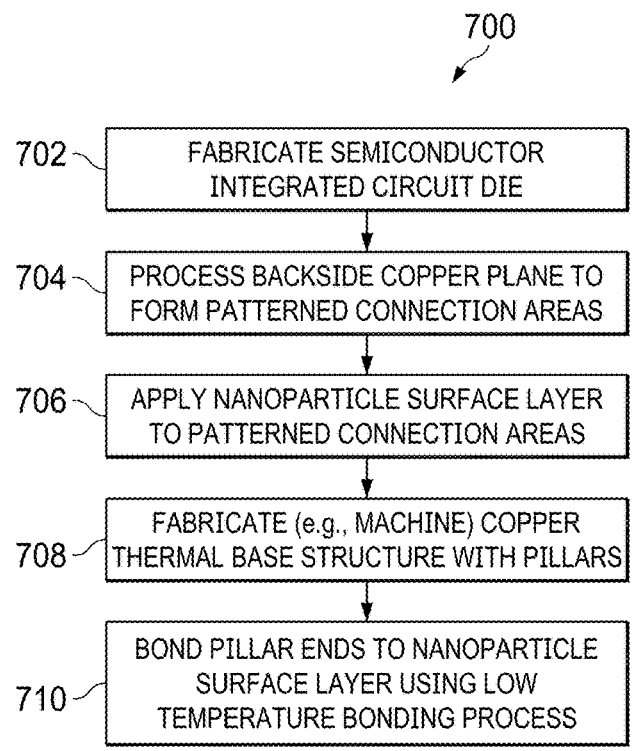
FIG. 7 is a high-level flow diagram for a process of forming a mechanically improved microelectronic thermal interface structure for low die stress in accordance with embodiments of the present disclosure.

FIG. 7 is a high-level flow diagram for a process of forming a mechanically improved microelectronic thermal interface structure for low die stress in accordance with embodiments of the present disclosure. The process 700 depicted begins with fabrication of a semiconductor integrated circuit die (step 702). A backside copper plane is formed on the semiconductor integrated circuit die and patterned to form semiconductor die thermal interface surfaces (connection areas) (step 704). A copper nanoparticle material interface layer is applied to each of the connection areas (step 706). A copper thermal base structure with geometric features for strain relief (pillars with aspect ratio greater than 1:1) is fabricated by, for example, micromachining (step 708). The ends of the geometric strain relief features on the copper thermal base structure are then each bonded to one of the copper nanoparticle material interface layers (step 710).

FIG. 8 is a plot, for a number of the materials listed in TABLE 1, of the material thermal conductivity (W/m·K) as a function of the in-plane (and, for copper molybdenum copper, through-thickness) coefficient of thermal expansion for the respective material in parts per million per Kelvin (ppm/K). As a result of the material mismatches in thermal expansion rates, thermal performance is limited by the TIMs, with a cost driven by the multiple processes required to form the stack and attached the integrated circuit die to the heat spreader.

The present disclosure describes a thermal structure for device cooling in which the semiconductor device is fabricated with a backside pattern of a plurality of thermal interface surfaces, a nanoparticle material interface is applied to the device thermal interface surfaces, and a thermal spreader structure with a plurality of geometric features for strain relief each includes a thermal interface bonded to device thermal interface surfaces using the nanoparticle material interface. All of the thermal interfaces bonded may be metals, such as copper, gold, or other diffusible metal with low temperature bond capability. Alternatively, one or more the thermal interfaces bonded may be dielectric materials (nitride, oxide, etc.), solder, epoxy, or other bond material. The thermal spreader structure may be integrated into a housing or base plate structure or may be directly attached to a circuit board with, for example the nanoparticle material, solder, diffusion bond, or another attachment method. The thermal spreader structure may be plated or machined into a thick copper section of a circuit board. The geometric strain relief features in thermal spreader structure may also be used for additional surface area for cooling with a second cooling material (i.e., air, liquids, or phase change materials). The geometric strain relief features in the thermal spreader structure may be formed as pillars that provide flexibility and strain relief in one or both directions defined by a major plane of the semiconductor device or as springs that provide flexibility and strain relief in direction. The thermal spreader structure may include a combination of a solid central semiconductor attachment region and peripheral pillars for strain relief.

Optionally, thermal spreader structure may have a smaller area than semiconductor device. Alternatives to use of the nanoparticle material interface include: mixture of copper micro and nanoparticles, high tin solder, which requires only low bonding temperature/pressure; high temperature bonding materials, which may exhibit CTE mismatch but only over smaller areas; copper-tin-copper micro-bumps, which exhibit diffusion at low temperature and are stable over time; or a high tin (e.g., Sn97) material. Copper is preferred because the CTE of PCBs is typically well-matched to that of copper. Low temperature sintering copper nanoparticles to form the interface at 170-225° C. is much simpler than soldering or other joining methods. Different sintering temperatures can be designed by selecting different particle sizes. Copper microparticles can be mixed with the nanoparticles to adjust thermal and mechanical properties.

It is preferable that the thermal spreader structure be bonded to the semiconductor device at room temperature, since bonding at high temperature extremes are a stress failure point placing the semiconductor die in tension (brittle) while bonding at low temperature extremes are also a stress failure point, but placing die in compression.

Many methods may be employed to process the copper of some embodiments described above, including without limitation: additive process, patterning layer-by-layer; wire electrical discharge machining (EDM); and preferential etch. Alternative vertical strain relief features to the pillars described include, without limitation: S-shaped "springs" previously described; cantilevers; or coils. As used herein, "pillar" includes solid or annular pillars, rectangular, cylindrical, conical or frustoconical pillars, and pillars with straight, convex or concave sides, as well as the S-shaped "spring" pillars described in connection with FIG. 3 and helical coil pillars. It should be noted that the pillars and nanoparticle interface layers may accommodate differences in height at the bond line, provide tolerance between (nonplanar) surfaces, and provide compliance in the Z direction. The pillars described herein differs from solder bump and column grid array interfaces in that pillars project up from the base of the thermal spreader structure rather than down from the die (i.e., toward die rather than toward the PCB).

Modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A heat dissipation structure, comprising:
    a semiconductor integrated circuit die having a plurality of connection areas;
    a thermal mount comprising a plurality of pillars projecting from a surface thereof, each pillar of the plurality of pillars having an aspect ratio greater than 1:1 and each pillar of the plurality of pillars positioned to connect to one connection area of the plurality of connection areas on a peripheral portion of the semiconductor integrated circuit die; and
    a plurality of interface layers, each interface layer of the plurality of interface layers connecting one pillar of the plurality of pillars and the respective one connection area of the plurality of connection areas,
    wherein each connection area of the plurality of connection areas, the thermal mount, each pillar of the plurality of pillars and each interface layer of the plurality of interface layers has a thermal conductivity greater than or equal to 60 Watts per meter degree Kelvin (W/m·K),
    wherein flexure of each pillar of the plurality of pillars accommodates mechanical strain arising from temperature changes and differences in coefficients of thermal expansion for materials of the semiconductor integrated circuit die and the thermal mount, and
    wherein each pillar of the plurality of pillars has an aspect ratio dependent upon a position of one connection area of the plurality of connection areas corresponding to the respective pillar relative to a center of the semiconductor integrated circuit die, and wherein pillars of the plurality of pillars that are further from the center have a greater aspect ratio than pillars of the plurality of pillars that are closer to the center.

2. The heat dissipation structure according to claim 1, wherein each connection area of the plurality of connection areas, the thermal mount and each pillar of the plurality of pillars each comprise copper, and wherein each interface layer of the plurality of interface layers comprises a copper nanoparticle layer.

3. The heat dissipation structure according to claim 1, wherein each pillar of the plurality of pillars deforms in each of three independent directions.

4. The heat dissipation structure according to claim 1, further comprising:
    a copper heat spreader on a circuit board.

5. The heat dissipation structure according to claim 4, further comprising:
    a copper nanoparticle interface layer connecting the thermal mount and the copper heat spreader.

6. The heat dissipation structure according to claim 1, wherein the thermal mount further comprises a central support projecting from the surface thereof, the central support having an aspect ratio less than 1:1 and connected to one of the plurality of connection areas on a central portion of the semiconductor integrated circuit die by an additional interface layer.

7. The heat dissipation structure according to claim 6, wherein each connection area of the plurality of connection areas, the thermal mount, each pillar of the plurality of pillars and the central support each comprise copper, and wherein each interface layer of the plurality of interface layers comprises a copper nanoparticle layer.

8. A method, comprising:
forming a plurality of connection areas on a semiconductor integrated circuit die;
forming a thermal mount comprising a plurality of pillars projecting from a surface thereof, each pillar of the plurality of pillars having an aspect ratio greater than 1:1 and each pillar of the plurality of pillars positioned to connect to one connection area of the plurality of connection areas on a peripheral portion of the semiconductor integrated circuit die; and
connecting each pillar of the plurality of pillars to a respective one connection area of the plurality of connection areas with one interface layer of a plurality of interface layers,
wherein each connection area of the plurality of connection areas, the thermal mount, each pillar of the plurality of pillars and each interface layer of the plurality of interface layers has a thermal conductivity greater than or equal to 60 Watts per meter degree Kelvin (W/m·K),
wherein flexure of the plurality of pillars accommodates mechanical strain arising from temperature changes and differences in coefficients of thermal expansion for materials of the semiconductor integrated circuit die and the thermal mount, and
wherein each pillar of the plurality of pillars has an aspect ratio dependent upon a position of one connection area of the plurality of connection areas corresponding to the respective pillar relative to a center of the semiconductor integrated circuit die, and wherein pillars of the plurality of pillars that are further from the center have a greater aspect ratio than pillars of the plurality of pillars that are closer to the center.

9. The method according to claim 8, wherein each connection area of the plurality of connection areas, the thermal mount and each pillar of the plurality of pillars each comprise copper, and wherein each interface layer of the plurality of interface layers comprises a copper nanoparticle layer.

10. The method according to claim 8, wherein each pillar of the plurality of pillars deforms in each of three independent directions.

11. The method according to claim 8, further comprising:
providing a copper heat spreader on a circuit board.

12. The method according to claim 11, further comprising:
connecting the thermal mount to the copper heat spreader with a copper nanoparticle interface layer.

13. The method according to claim 8, wherein the thermal mount further comprises a central support projecting from the surface thereof, the central support having an aspect ratio less than 1:1 and connected to one of the plurality of connection areas on a central portion of the semiconductor integrated circuit die by an additional interface layer.

14. The method according to claim 13, wherein each connection area of the plurality of connection areas, the thermal mount, each pillar of the plurality of pillars and the central support each comprise copper, and wherein each interface layer of the plurality of interface layers comprises a copper nanoparticle layer.

15. A heat dissipation structure, comprising:
a semiconductor integrated circuit die having a plurality of copper connection areas;
a copper thermal mount comprising a plurality of copper pillars projecting from a surface thereof, each copper pillar of the plurality of copper pillars positioned to connect to one copper connection area of the plurality of copper connection areas on a peripheral portion of the semiconductor integrated circuit die; and
a plurality of copper nanoparticle interface layers, each copper nanoparticle interface layer of the plurality of copper nanoparticle interface layers connecting one copper pillar of the plurality of copper pillars and the respective one copper connection area of the plurality of copper connection areas,
wherein flexure of the plurality of copper pillars accommodates mechanical strain arising from temperature changes and differences in coefficients of thermal expansion for materials of the semiconductor integrated circuit die and the copper thermal mount, and
wherein the copper thermal mount further comprises a central copper support projecting from the surface thereof, the central copper support connected to one copper connection area of the plurality of copper connection areas on a central portion of the semiconductor integrated circuit die by an additional copper nanoparticle interface layer.

16. The heat dissipation structure according to claim 15, wherein each copper pillar of the plurality of copper pillars has an aspect ratio greater than 2:1.

17. The heat dissipation structure according to claim 15, wherein each copper pillar of the plurality of copper pillars has an aspect ratio dependent upon a position of one copper connection area of the plurality of copper connection areas corresponding to the respective copper pillar relative to a center of the semiconductor integrated circuit die, and wherein copper pillars further from the center have a greater aspect ratio than copper pillars closer to the center.

18. The heat dissipation structure according to claim 15, further comprising liquid coolant between at least neighboring copper pillars of the plurality of copper pillars at a center of the semiconductor integrated circuit die.

19. The heat dissipation structure according to claim 15, further comprising:
a copper heat spreader on a circuit board.

20. The heat dissipation structure according to claim 19, further comprising:
a second additional copper nanoparticle interface layer connecting the copper thermal mount and the copper heat spreader.

* * * * *